(12) United States Patent
Osuman

(10) Patent No.: US 9,752,807 B2
(45) Date of Patent: Sep. 5, 2017

(54) LITHOGRAPHIC APPARATUS AND TO A REFLECTOR APPARATUS

(71) Applicant: ASML Netherlands B.V., Veldhoven (NL)

(72) Inventor: Andani Alhassan Osuman, Amsterdam (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 14/773,120

(22) PCT Filed: Feb. 18, 2014

(86) PCT No.: PCT/EP2014/053060
§ 371 (c)(1),
(2) Date: Sep. 4, 2015

(87) PCT Pub. No.: WO2014/139763
PCT Pub. Date: Sep. 18, 2014

(65) Prior Publication Data
US 2016/0010901 A1 Jan. 14, 2016

Related U.S. Application Data

(60) Provisional application No. 61/789,752, filed on Mar. 15, 2013.

(51) Int. Cl.
*G03B 27/42* (2006.01)
*F25B 21/04* (2006.01)
(Continued)

(52) U.S. Cl.
CPC .............. *F25B 21/04* (2013.01); *G02B 7/181* (2013.01); *G03F 7/70891* (2013.01); *H01L 35/30* (2013.01); *H01L 35/32* (2013.01)

(58) Field of Classification Search
CPC ......... H01L 35/32; H01L 35/30; H01L 23/34; H01L 2225/1094; H01L 27/0248; H01L 27/16; H01L 35/28; H01L 2023/4037; H01L 2023/4043; H01L 2023/405; H01L 2023/4062; H01L 21/4882; H01L 23/367;
(Continued)

(56) References Cited

U.S. PATENT DOCUMENTS 5,856,210 A * 1/1999 Leavitt .................... H01L 35/34
438/54
6,198,579 B1 3/2001 Rupp
(Continued)

OTHER PUBLICATIONS

International Search Report directed to related International Patent Application No. PCT/EP2014/053060, mailed Sep. 25, 2014; 3 pages.
(Continued)

*Primary Examiner* — Mesfin Asfaw
(74) *Attorney, Agent, or Firm* — Sterne, Kessler, Goldstein & Fox P.L.L.C.

(57) ABSTRACT

Disclosed is a reflector apparatus comprising a reflector and an array of thermoelectric heat pumps each having a first end proximal to and in thermal contact with the reflector and having a second end distal from the reflector, a lithography tool having such a reflector apparatus, and a method of using the same.

20 Claims, 2 Drawing Sheets

(51) Int. Cl.
G03F 7/20 (2006.01)
H01L 35/30 (2006.01)
H01L 35/32 (2006.01)
G02B 7/18 (2006.01)

(58) Field of Classification Search
CPC ....... H01L 23/373; H01L 23/38; H01L 23/40; G02B 7/008
See application file for complete search history.

(56) References Cited

U.S. PATENT DOCUMENTS

| | | |
|---|---|---|
| 6,230,497 B1 | 5/2001 | Morris et al. |
| 2004/0051984 A1 | 3/2004 | Oshino et al. |
| 2010/0200777 A1* | 8/2010 | Hauf .................... G02B 7/1815 250/504 R |
| 2011/0176121 A1 | 7/2011 | Loopstra et al. |

OTHER PUBLICATIONS

International Preliminary Report on Patentability and Written Opinion of the International Searching Authority directed to related International Patent Application No. PCT/EP2014/053060, issued Sep. 15, 2015; 5 pages.

* cited by examiner

LITHOGRAPHIC APPARATUS AND TO A REFLECTOR APPARATUS

CROSS-REFERENCE TO RELATED APPLICATIONS

This application claims the benefit of U.S. provisional application 61/789,752, which was filed on 15 Mar. 2013, and which is incorporated herein in its entirety by reference.

BACKGROUND

Field

The present invention relates to a lithographic apparatus and to a reflector apparatus.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, k1 is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of k1.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector apparatus for containing the plasma. The plasma may be created, for example, by directing a laser beam at a fuel, such as particles of a suitable material (e.g., tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector apparatus may include an enclosing structure or chamber arranged to provide a vacuum environment to support the plasma. Such a radiation system is typically termed a laser produced plasma (LPP) source.

SUMMARY

It may be desirable to control the temperature of a reflector (e.g., a mirror) in a manner which is novel and inventive over the prior art. The reflector may for example form part of a lithographic apparatus, or form part of a laser, or form part of a beam delivery system.

According to a first aspect of the invention there is provided a reflector apparatus comprising
  a reflector and an array of thermoelectric heat pumps each having a first end proximal to and in thermal contact with the reflector and having a second end distal from the reflector, and;
  a controller configured to control the thermoelectric heat pumps, whereby the controller is configured to determine a temperature of the reflector from a voltage measured across at least one of the thermoelectric heat pumps.

Each thermoelectric heat pump may comprise a pair of semiconductor blocks, a first block being positively doped and a second block being negatively doped.

The array of thermoelectric heat pumps may be a two-dimensional array.

The thermoelectric heat pumps may be arranged as a hexagonal array or a rectangular array.

The reflector apparatus may further comprise a controller configured to control the thermoelectric heat pumps.

The controller may be configured to control a voltage applied across the thermoelectric heat pumps.

The controller may be configured to use feed-forward correction to control the thermoelectric heat pumps.

The controller may be configured to use feed-back correction to control the thermoelectric heat pumps.

The controller may be configured to obtain measurements for the feed-back correction by periodically measuring voltages across the thermoelectric heat pumps.

The thermoelectric heat pumps may be individually controllable.

The controller may be configured to adjust a wavefront of radiation reflected by the reflector, by maintaining a temperature difference between mirror areas connected to adjacent thermoelectric heat pumps.

The controller may be configured to maintain a substantially equal temperature across the reflector using the thermoelectric heat pumps.

The controller may be configured to reverse the polarity of current supplied to the thermoelectric elements if radiation ceases to be incident upon the reflector.

The second end of each thermoelectric heat pump may be connected to a temperature stabilized block.

According to a second aspect of the invention there is provided a laser or beam delivery system comprising the reflector apparatus of the first aspect of the invention. Any feature of the first aspect of the invention may be combined with the second aspect of the invention.

According to a third aspect of the invention there is provided a lithographic apparatus comprising an illumination system configured to condition a radiation beam, a substrate table constructed to hold a substrate, and a projection system configured to project the radiation beam onto a target portion of the substrate, wherein a reflector of the illumination system or the projection system is a reflector apparatus according to the first aspect of the invention. Any feature of the first aspect of the invention may be combined with the third aspect of the invention.

The lithographic apparatus may further comprise a support constructed to support a patterning device, the patterning device being capable of imparting the radiation beam with a pattern in its cross-section to form a patterned radiation beam.

According to a fourth aspect of the invention there is provided a method of controlling the temperature of a reflector, the method comprising supplying power to an array of thermoelectric heat pumps each having a first end proximal to and in thermal contact with the reflector and having a second end distal from the reflector, the power supplied to the array of thermoelectric heat pumps causing the thermoelectric heat pumps to remove heat from or transfer heat to the reflector.

A temperature difference may be maintained between mirror areas connected to adjacent thermoelectric heat pumps, thereby adjusting a wavefront of radiation reflected by the reflector.

The spatial intensity of the radiation may be adjusted to more closely correspond to a distribution of fuel upon which the radiation is incident.

A substantially equal temperature may be maintained across the reflector using the thermoelectric heat pumps.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein. In particular, the array of thermoelectric heat pumps may also be applied for thermal conditioning of other objects, apart from the reflectors as mentioned above. As an example, the array of thermoelectric heat pumps may e.g. be applied for the thermal conditioning of a substrate or patterning device. In such arrangement, the present invention may be embodied in a support for supporting an object such as a substrate or a patterning device, the support comprising a support surface configured to receive the object, the support further comprising:

an array of thermoelectric heat pumps each having a first end proximal to and in thermal contact with the support surface and having a second end distal from the support surface, and;

a controller configured to control the thermoelectric heat pumps, whereby the controller is configured to, in use, determine a temperature of the object from a voltage measured across at least one of the thermoelectric heat pumps.

BRIEF DESCRIPTION OF THE DRAWINGS

Embodiments of the invention will now be described, by way of example only, with reference to the accompanying schematic drawings in which corresponding reference symbols indicate corresponding parts, and in which.

Figure 1:
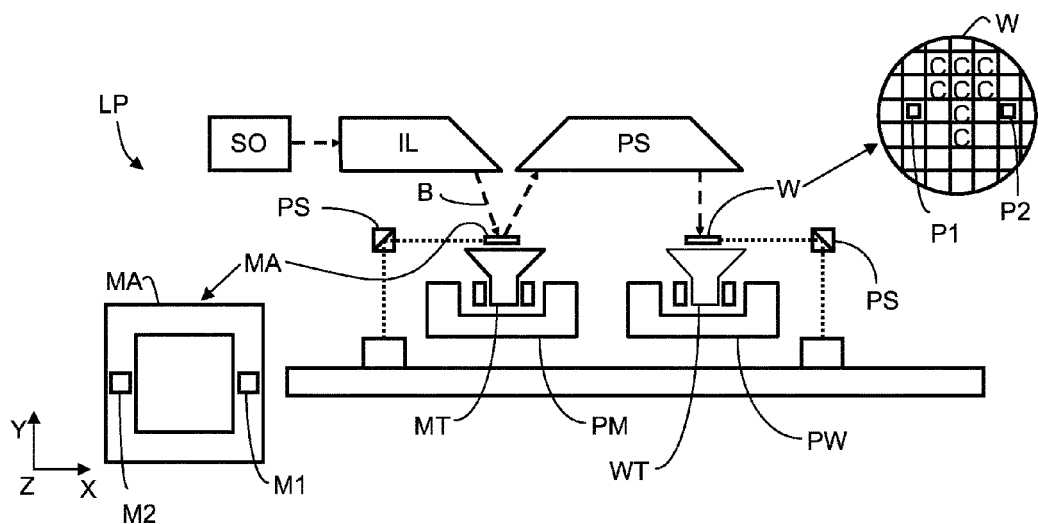
FIG. 1 depicts a lithographic apparatus according to an embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, or structurally similar elements. The drawing in which an element first appears is indicated by the leftmost digit(s) in the corresponding reference number.

DETAILED DESCRIPTION

This specification discloses embodiments that incorporate the features of this invention. The disclosed embodiments merely exemplify the invention. The scope of the invention is not limited to the disclosed embodiments. The invention is defined by the claims appended hereto.

The embodiments described, and references in the specification to "one embodiment," "an embodiment," "an example embodiment," "some embodiments," etc., indicate that the embodiments described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

FIG. 1 schematically depicts a lithographic apparatus LP including a source collector apparatus SO according to one embodiment of the invention. The lithographic apparatus comprises:

an illumination system (illuminator) IL configured to condition a radiation beam B (e.g., EUV radiation).

a support structure (e.g., a mask table) MT constructed to support a patterning device (e.g., a mask or a reticle) MA and connected to a first positioner PM configured to accurately position the patterning device;

a substrate table (e.g., a wafer table) WT constructed to hold a substrate (e.g., a resist-coated wafer) W and connected to a second positioner PW configured to accurately position the substrate; and a projection system (e.g., a reflective projection system) PS configured to project a pattern imparted to the radiation beam B by patterning device MA onto a target portion C (e.g., comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g., employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector apparatus SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector apparatus SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector apparatus. The laser and the source collector apparatus may be separate entities, for example when a $CO_2$ laser is used to provide the laser beam for fuel excitation. In such cases, the laser may be considered not to form part of the lithographic apparatus LP. The laser beam may passed from the laser to the source collector apparatus SO with the aid of a beam delivery system comprising, for example, suitable directing mirrors and/or a beam expander.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

The depicted apparatus could be used in at least one of the following modes:

1. In step mode, the support structure (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.

2. In scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
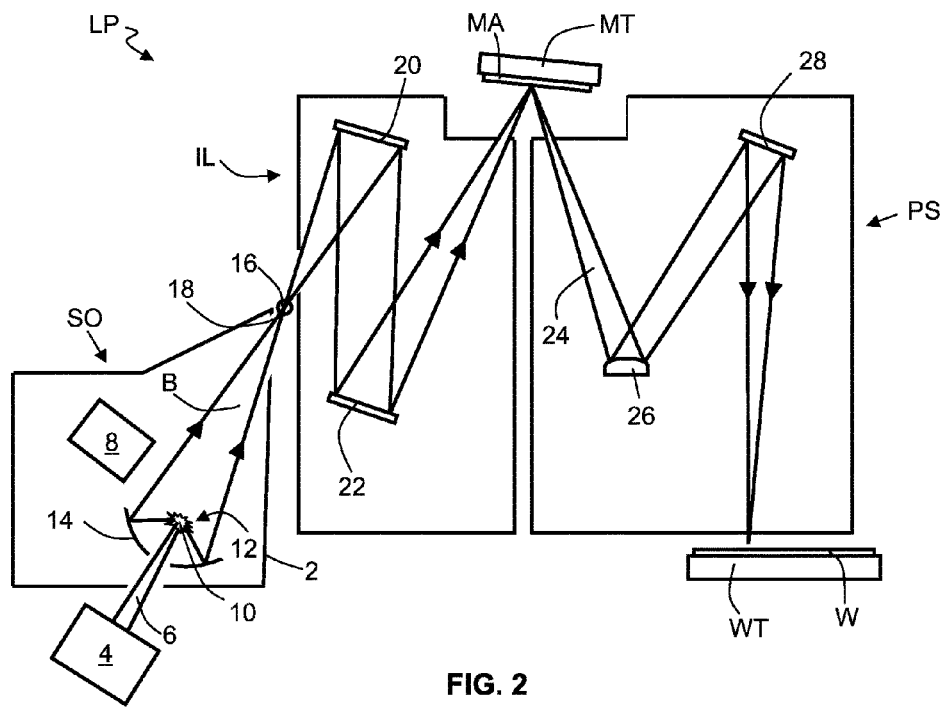
FIG. 2 is a more detailed view of the lithographic apparatus LP.

FIG. 2 shows the lithographic apparatus LP in more detail, including the source collector apparatus SO, the illumination system IL, and the projection system PS. The source collector apparatus SO is constructed and arranged such that a vacuum environment can be maintained in an enclosing structure 2 of the source collector apparatus.

A laser 4 is arranged to deposit laser energy via a laser beam 6 into a fuel, such as tin (Sn) or lithium (Li) which is provided from a fluid stream generator 8. Liquid (i.e., molten) tin (most likely in the form of droplets), or another metal in liquid form, is currently thought to be the most promising and thus likely choice of fuel for EUV radiation sources. The deposition of laser energy into the fuel creates a highly ionized plasma at a plasma formation region 12 which has electron temperatures of several tens of electron volts (eV). The energetic radiation generated during de-excitation and recombination of these ions is emitted from the plasma 10, collected and focused by a near normal incidence radiation collector 14 (sometimes referred to more generally as a normal incidence radiation collector). The collector 14 may have a multilayer structure, for example one tuned to reflect, more readily reflect, or preferentially reflect, radiation of a specific wavelength (e.g., radiation of a specific EUV wavelength). The collector 14 may have an elliptical configuration, having two natural ellipse focal points. One first focal point 10 will be at the plasma formation region 12, and the other, second focal point will be at the intermediate focus 16, discussed below.

The collector 14 in the enclosing structure 2 also form a part of the source collector apparatus SO (in this example).

A second laser (not shown) may be provided, the second laser being configured to preheat the fuel before the laser beam 6 is incident upon it. An LPP source which uses this approach may be referred to as a dual laser pulsing (DLP) source. Such a second laser may be described as providing a pre-pulse into a fuel target, for example to change a property of that target in order to provide a modified target. The change in property may be, for example, a change in temperature, size, shape or the like, and will generally be caused by heating of the target.

Although not shown in FIG. 1, the fuel stream generator will comprise, or be in connection with, a nozzle configured to direct a stream of, for example, fuel droplets along a trajectory towards the plasma formation region 12.

Radiation B that is reflected by the radiation collector 14 is focused at point 16 to form an image of the plasma formation region 12 which in turn acts as a radiation source for the illuminator IL. The point 16 at which the radiation B is focused is commonly referred to as the intermediate focus, and the source collector apparatus SO is arranged such that the intermediate focus 16 is located at or near to an opening 18 in the enclosing structure 2. An image of the radiation emitting plasma 10 is formed at the intermediate focus 16.

Subsequently, the radiation B traverses the illumination system IL, which may include a facetted field mirror device 20 and a facetted pupil mirror device 22 arranged to provide a desired angular distribution of the radiation beam B at the patterning device MA, as well as a desired uniformity of radiation intensity at the patterning device MA. Upon reflection of the beam of radiation at the patterning device MA, held by the support structure MT, a patterned beam 24 is formed and the patterned beam 24 is imaged by the projection system PS via reflective elements 26, 28 onto a substrate W held by the wafer stage or substrate table WT.

More elements than shown may generally be present in the illumination system IL and projection system PS. Furthermore, there may be more mirrors present than those shown in the figures, for example there may be 1-6 additional reflective elements present in the projection system PS than shown in FIG. 2.

In order to provide the laser beam 6 with sufficient intensity to generate the EUV emitting plasma, the laser 4 may include more than one gain medium. Mirrors may be used to guide the laser beam between gain media. Mirrors may be used in a beam delivery system (not shown) used to deliver the laser beam 6 from the laser 4 to the source collector apparatus SO. The power of the laser beam 6 may be such that it causes significant heating of these mirrors. The laser beam 6 will not deliver heat evenly across the surface of a mirror, but will instead deliver heat with a profile which corresponds with the intensity profile of the laser beam (e.g., Gaussian, top hat, etc). The laser beam 6 may be periodically blocked, or the laser periodically switched off. This may occur for example when a substrate W which has been exposed is being removed from the substrate table WT and replaced with a new substrate to be exposed.

For the above reasons, there may be a temperature distribution across the surface of a mirror in the laser or in the beam delivery system, and furthermore this temperature distribution may vary over time (this may be referred to as thermal instability). Thermal instability of a mirror of the laser or the beam delivery system may introduce instability in the location at which the laser beam 6 is focused. This could be caused for example by a deviation of the direction in which the laser beam 6 points, and/or by a shift of a plane in which the laser beam is focused. This is undesirable because the laser beam 6 should be aligned with fuel droplets in a consistent manner in order to avoid unwanted power variation between pulses of EUV radiation generated by the source collector apparatus SO. Embodiments of the invention address this problem.

Figure 3:
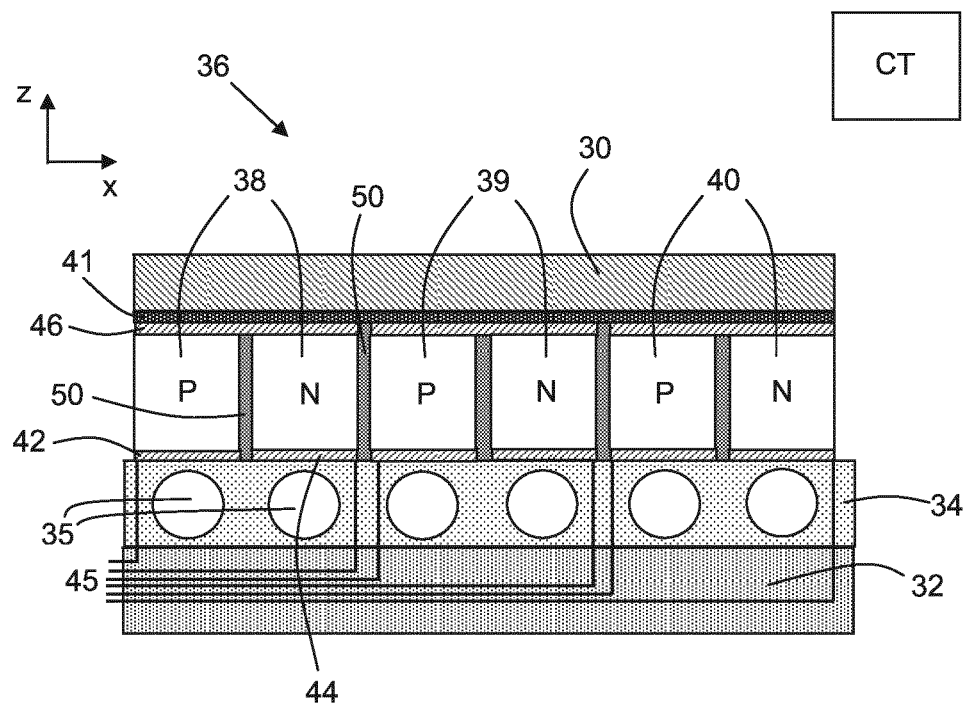
FIG. 3 is schematic cross-sectional view of a reflector apparatus according to an embodiment of the invention.

FIG. 3 shows schematically in cross-section a reflector apparatus 36 according to an embodiment of the invention. The reflector apparatus 36 comprises a reflector (in this case a mirror 30) and an array of thermoelectric heat pumps 38-40. The thermoelectric heat pumps 38-40 may be used to control the temperature of the mirror. This may reduce or eliminate unwanted thermally induced movement of the location at which the laser beam 6 is focused. The mirror 30 may for example be located in the laser 4 (see FIG. 2) or in a beam delivery system configured to deliver the laser beam 6 from the laser to the source collector apparatus SO. The mirror 30 may for example be formed from copper. Copper is a good reflector of infrared radiation as generated by a CO2 laser (the laser 4 of FIG. 2 may be a CO2 laser).

The mirror 30 is supported by a substrate 32. The array of thermoelectric heat pumps 38-40 and a temperature stabilized block 34 are located between the mirror 30 and the substrate 32. A first end of each thermoelectric heat pump 38-40 is located proximal to the mirror 30 and is in thermal contact with the mirror. A second end of each thermoelectric heat pump 38-40 is located distal from the mirror 30. The term "thermal contact" may be interpreted as meaning that a substantial amount of heat can flow between the thermoelectric heat pumps 38-40 and the mirror 30 (e.g., sufficient heat to allow the temperature of the mirror to be controlled). Thermal contact still exists when materials such as an electrical insulator 41 is located between the heat pumps 38-40 and the mirror 30, because heat may flow through those materials.

The temperature stabilized block 34 is provided with a plurality of conduits 35 through which water (or other fluid) may flow in use. The water has a desired temperature (e.g., 21° C.) and stabilizes the temperature stabilized block at that temperature. Any suitable form of temperature stabilized block may be used.

The array of thermoelectric heat pumps 38-40 is a two-dimensional array. Each thermoelectric heat pump 38-40 comprises a pair of semiconductor blocks, a first semiconductor block of the pair comprising a p-doped semiconductor and a second semiconductor block of the pair comprising an n-doped semiconductor.

Figure 4:
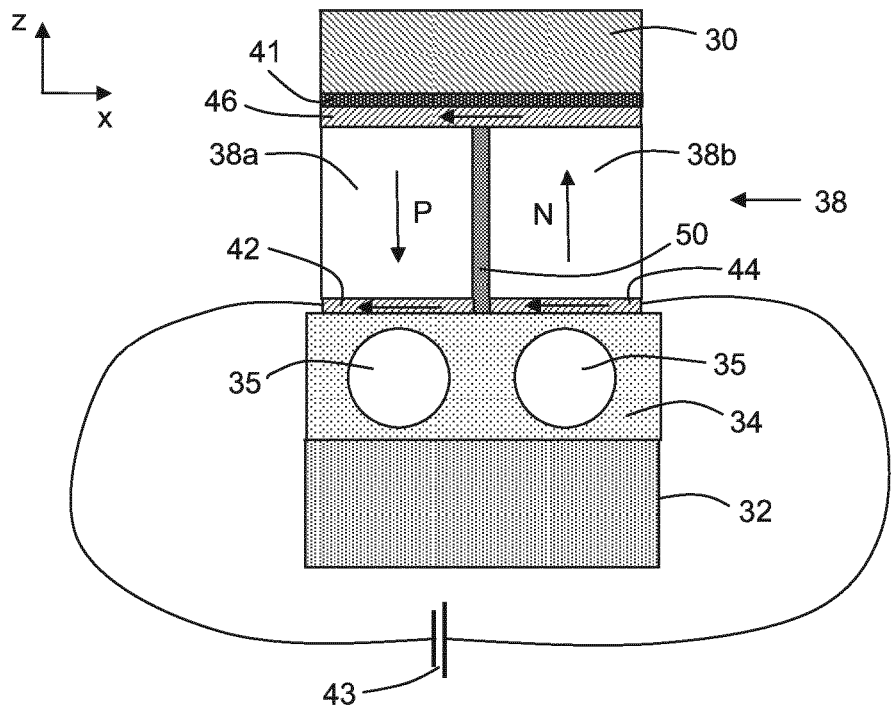
FIG. 4 is an enlarged cross-sectional view of the reflector apparatus of FIG. 3.

A first pair 38a, 38b of semiconductor blocks is schematically shown in an enlarged view in FIG. 4. FIG. 4 schematically illustrates the manner in which the thermoelectric heat pump 38 controls the temperature of the mirror 30. A conductor 46 electrically connects the p-doped semiconductor 38a to the n-doped semiconductor 38b on the mirror side of the semiconductor blocks. An electrical insulator 41 is provided between the conductor 46 and the mirror 30 in order to prevent electrical conduction between them (if the mirror is formed from an electrically conducting material). The electrical insulator 41 may be thin in order to allow heat to pass easily from the mirror 30 to the thermoelectric heat pump 38. The electrical insulator 41 may for example be a ceramic (e.g., a ceramic plate). Electrical insulators which could be used include aluminium nitride (AlN) or beryllium oxide (BeO), which have thermal conductivities of 385 and 301 $Wm^{-1}K^{-1}$ respectively. AlN may be preferred over BeO because BeO is toxic. Less expensive alternative materials, such as Al2O3, may be used, but these may have a significantly lower thermal conductivity (e.g., around 30 $Wm^{-1}K^{-1}$).

The semiconductors blocks 38a, 38b are not connected on an opposite side (i.e., the side which faces the temperature stabilized block 34). Instead, this side of the p-doped semiconductor block 38a is connected to a negative terminal of a power source 43 via a conductor 42. An equivalent side of the n-doped semiconductor block 38b is connected via a conductor 44 to a positive side of the power source 43. In use, a voltage is applied by the power source 43, causing current to pass through the conductors 42, 44, 46 in the direction indicated by arrows, and also to pass through the semiconductor blocks 38a, 38b in the direction indicated by arrows.

Referring first to the n-doped semiconductor block 38b, electrons flow from a mirror side of the semiconductor block to a temperature stabilized block side of the semiconductor block due to the voltage established across the semiconductor block by the power source 43. By convention, the direction of current flow as indicated by the arrows is opposite to the direction of flow of electrons. The electrons at the mirror side of the semiconductor block 38b are heated by heat from the mirror 30 (the mirror is heated by an incident laser beam (not shown)). These heated electrons travel to the temperature stabilized block side of the semiconductor block 38b, and thus transfer heat from the mirror side to the temperature stabilized block side of the semiconductor block. The heat is received at the temperature stabilized block 34 and is removed from the temperature stabilized block by water (or other fluid) flowing through the conduits 35.

An equivalent process takes place in the p-doped semiconductor block 38a, with positively charged carriers (holes) carrying heat from the mirror side of the semiconductor block to the temperature stabilized block side of the semiconductor block. The heat is received at the temperature stabilized block 34 and is removed from the temperature stabilized block.

The power source 43 thus drives heated carriers from the mirror side of the semiconductor blocks 38a, 38b to the temperature stabilized block side. The thermoelectric heat pump 38 thus provides cooling of the mirror 30. The cooling effect used may be referred to as the thermoelectric effect or the Peltier effect.

The amount of cooling which is provided by the thermoelectric heat pump 38 may be controlled by adjusting the power provided to it by the power source 43. Referring again to FIG. 3, the power supplied to individual thermoelectric heat pumps 38-40 may be independently controlled, such that each pair of thermoelectric heat pumps provides a desired amount of cooling. This independent control is achieved by providing separate electrical connections 45 to the conductors 42, 44, 46. The electrical connections 45 may pass upwards through the temperature stabilized block 34 to the conductors 42, 44, 46 as shown (or may be connected to the conductors in some other configuration).

In an embodiment, the thermoelectric heat pump 39 at the centre of the mirror 30 may receive more heat than the thermoelectric heat pumps 38, 40 at sides of the mirror. The power provided to this thermoelectric heat pump 39 may accordingly be greater than the power provided to the other thermoelectric heat pumps 38, 40, thereby providing more cooling to the centre of the mirror 30 than is provided at sides of the mirror. Although FIG. 3 shows three thermoelectric heat pumps 38-40, a larger number of thermoelectric heat pumps may be used (e.g., provided in a two dimensional array).

The sizes of the thermoelectric heat pumps may for example be selected to provide control of the temperature of the mirror 30 with a spatial resolution across the surface of the mirror (as is discussed further below). In an embodiment, each thermoelectric heat pump 38-40 may for example measure around 15 mm by 15 mm (viewed from the z-direction looking towards the thermoelectric heat pump). However, the thermoelectric heat pumps 38-40 may have any suitable size.

Electrical insulation 50 may be provided between the thermoelectric heat pumps 38-40 and between the conductors 42, 44, 46. The electrical insulation 50 may be a good thermal conductor. This will help to reduce temperature differences between adjacent thermoelectric heat pumps 38-40 (which may be advantageous if it desired to maintain a substantially constant temperature across the surface of the mirror 30).

The temperature stabilized block 34 may be formed from electrically insulating material. If the temperature stabilized block 34 is not formed from electrically insulating material, then an electrical insulator may be provided between the conductors 42, 44 and the temperature stabilized block. Similarly, if the mirror 30 is formed from an electrically insulating material then the electrical insulator 41 is not required.

The temperature of the temperature stabilized block 34 may tend towards a temperature (this may be considered to be temperature stabilization). For example, if the fluid supplied to the temperature stabilized block 34 has a temperature of 21° C., then the block will tend towards that temperature. If the mirror 30 receives heat which is transferred to the temperature stabilized block 34, this may elevate the temperature of the block above 21° C., but the fluid will remove heat from the block until the temperature of the block returns to 21° C. If heat is being continuously transferred to the mirror 30 (e.g., by a laser), then the temperature stabilized block 34 may have a temperature which is slightly above the temperature of the fluid.

The reflector apparatus 36 may for example be controlled by a controller CT. The controller CT may for example comprise a processor, which may determine the power to be supplied to each thermoelectric heat pump 38-40. Referring again to FIG. 4, when the power source 43 is switched off, the voltage across the conductors 42, 44 is indicative of the temperature difference between the mirror 30 and the temperature stabilized block 34. The temperature of the temperature stabilized block 34 may be known (e.g., through measurement using a sensor). Therefore, the voltage across the conductors 42, 44 may be used to determine the temperature of the mirror 30. The temperature measurements are measurements of the temperature of the mirror 30 in the vicinity of each thermoelectric heat pump 38-40. Since the thermoelectric heat pumps 38-40 are arranged in a two-dimensional array beneath the mirror 30, the thermoelectric heat pumps provide measurements of the temperature of the mirror at an array of locations across the surface of the mirror.

In an embodiment, a dedicated set of one or more thermoelectric heat pumps of the array of thermoelectric heat pumps is used for temperature measurements. In such embodiment, the dedicated set may e.g. be selected to substantially cover the entire surface of the reflector or may be selected to assess the temperature of a particular region of interest of the surface of the reflector.

Alternatively, or in addition, one or more of the thermoelectric heat pumps may alternatingly be applied as a temperature sensor and as a heat source or drain. In such arrangement, the controller CT may be configured to alternatingly apply the supply voltage to at least one of the thermoelectric heat pumps in order to heat or cool the reflector and disconnect the at least one of the thermoelectric heat pumps from the supply voltage to enable a measurement of the voltage across the at least one of the thermoelectric heat pumps. By doing so, the temperature at particular positions or areas of interest may accurately be examined (by e.g. applying the nearest thermoelectric heat pump or heat pumps as a temperature sensor) and subsequently be adjusted by applying the same heat pumps as a heat source or drain.

In an embodiment, the controller CT may periodically interrupt the supply of power from power sources to the thermoelectric heat pumps, to periodically obtain temperature measurements across the surface of the mirror 30. These temperature measurements provide feedback which may be used by the controller CT to adjust the power being supplied to the thermoelectric heat pumps 38-40, and hence to locally adjust the cooling being provided by the thermoelectric heat pumps (or heating provided by the thermoelectric heat pumps, as explained further below).

In an alternative embodiment, an array of temperature sensors which are not formed from the thermoelectric heat pumps 38-40 may be used to measure the temperature of the mirror and provide feedback to the controller CT. The temperature sensors may for example be conventional temperature sensors, which may for example be provided as an array. Temperature sensors may be provided at or close to the mirror 30. If the temperature sensors are provided away from the mirror 30 (e.g., adjacent to the conductors 42) then modeling may be used to link the temperature measurements obtained with the temperature of the mirror. The modeling may for example take into account thermal losses and/or cross-talk.

The controller CT may use a feed-forward model to determine, at least in part, the power to be delivered by power sources to the thermoelectric heat pumps. The feed-forward model may for example include a laser intensity measurement and/or a laser trigger signal. The feed-forward model may model the thermal behaviour of the mirror 30 during known operation processes of the lithographic apparatus. For example, referring to FIG. 2, the laser 4 may be switched off or blocked between exposures of successive substrates. The manner in which the mirror 30 cools when the laser is switched off and then heats up when the laser is switched on again may be modelled. This model may be used to determine how much power should be delivered by power sources to the thermoelectric heat pumps. The profile of the laser beam 6 during operation of the lithographic apparatus will be known in advance, and may be incorporated into the model used to provide the feed-forward control.

The feed-forward modeling may be supplemented by feedback, for example as measured in the manner described above. The feedback may act to prevent drift of the temperature of the mirror 30, which could otherwise occur over time.

In an embodiment, the reflector apparatus 36 may be used to hold the mirror 30 at a temperature which is substantially constant across the surface of the mirror. A temperature gradient through the mirror 30 may exist (in a direction perpendicular to the surface of the mirror—labeled as the z-direction in FIG. 3). That is, the radiation receiving surface of the mirror 30 may be hotter than the side of the minor which is in thermal contact with the thermoelectric heat pumps. In order to minimise this temperature gradient the minor may be thin, although remaining sufficiently thick to provide any necessary mechanical and optical properties. The minor may for example be in the form of a thin film which has reflective properties, the thin film being provided on a supporting substrate.

As mentioned further above, there may be periods of time during which the laser beam 6 is blocked or switched off, such that it is not incident upon the mirror 30. It may be desirable to prevent or reduce cooling of the mirror 30 which will occur in such a circumstance, since subsequent re-heating of the minor when the laser beam is once more incident upon the mirror may cause instability in the laser beam. The reflector apparatus 36 may be used in such a circumstance to deliver heat to the mirror 30. This is achieved by reversing the polarity of the power applied to the thermoelectric heat pumps 38-40 by the power source. A feed-forward model may be used to determine the amount of heat to be applied at different locations across the mirror 30 (feedback may additionally and/or alternatively be used).

The reflector apparatus 36 may be used to pump heat to the mirror 30 in any circumstance in which this is desired. For example, if a laser beam is delivered to a central region of a minor only, then edges of the mirror may be very much cooler than the centre of the minor. It may be desirable to pump heat to the edges of the mirror in this circumstance.

The reflector apparatus 36 may for example be used to keep the mirror 30 at a temperature which is substantially equal to the temperature of the temperature stabilized block 34. In this context the term "substantially equal" may be interpreted as having a difference of 0.1° C. or less, or having a difference of 0.01° C. or less. The temperature stabilized block 34 may be held at any suitable temperature. The temperature stabilized block 34 may for example may be held at a temperature of around 21° C. The fluid passing through the conduits 35 (e.g., water) may maintain the cooling block 34 at a desired temperature in a stable manner.

In an embodiment, the invention may be used to keep the temperature of the mirror 30 at a desired temperature. The desired temperature may for example be a temperature at which the minor was held when it was being polished during fabrication. This is advantageous because it prevents a difference between the temperature at which the minor was fabricated and the temperature at which the mirror is used causing unwanted distortion of the mirror.

Embodiments of the invention allow minors of the laser 4 and the beam delivery apparatus to be focusing minors. The use of focusing mirrors is generally avoided in prior art systems because thermal distortion caused for example by changes of the intensity of the laser beam 6 cause unwanted variation of the focusing provided by the minors. This causes instability of the position at which the laser beam is focused. This problem is avoided by embodiments of the invention because the temperature of the minors is controlled sufficiently accurately to avoid significant changes of the focusing provided by mirrors when the intensity of the laser beam changes.

As explained above, embodiments of the invention may be used to prevent or reduce temperature differences across the reflective surface of a mirror 30. Additionally and/or alternatively, the thermoelectric heat pumps 38-40 may be used to deliberately introduce temperature differences at specific locations on the mirror 30. The thermoelectric heat pumps may for example be used to adjust the position of a portion of the mirror 30 in a direction perpendicular to the surface of the minor (labeled as the z-direction in FIGS. 3 and 4). This may be thought of as deforming a portion of the mirror 30 in the z-direction. This may be done for example to correct or adjust in some way the wavefront of the laser beam 6 (e.g., to reduce or remove aberrations from the laser beam). It may be done for example to change the intensity profile of the laser beam at the radiation source SO.

In embodiments in which a temperature difference is desired between different locations on the mirror 30, thermal insulation is provided between the thermoelectric heat pumps 38-40. This may prevent or reduce cross-talk between the thermoelectric heat pumps. That is, the thermal insulation may prevent or reduce the flow of heat between thermoelectric heat pumps. The thermal insulation may for example comprise the material 50 shown in FIG. 3 (which may also act as an electrical insulator). This material, which may also be electrically insulating, may also extend upwards into the mirror 30. The thermal insulation 50 may stop short of the surface of the minor. The thermal insulation 50 may for example have a thickness of around 1 mm. The thermal insulation may for example be a material which provides a thermal conductivity of around 0.033 Wm-1K-1.

In contrast to this, in embodiments in which it is desired to provide a uniform or substantially uniform temperature across the reflective surface of the mirror, thermal insulation between thermoelectric heat pumps may be omitted. Any flow of heat between the thermoelectric heat pumps will tend to equalize the temperature across the reflective surface of the mirror, thereby providing a beneficial effect.

In order to be able to perform wavefront corrections, the accuracy with which the position of the minor in the z-direction can be controlled depends at least in part upon the wavelength of the radiation which is incident upon the mirror. For example, the thermoelectric heat pumps 38-40 may be arranged to allow the z-direction position of the minor to be controlled with an accuracy of around 0.01× wavelength of the incident radiation (although other accuracies may be used). If the radiation is for example an infrared laser beam generated by a CO2 laser with a wavelength of 10.6 microns, then the accuracy with which the temperature of the mirror is controlled may for example correspond with a z-direction position accuracy of around 0.1 microns. In general, the accuracy with which the z-direction position can be controlled affects the accuracy with which aberrations can be compensated. A lesser accuracy of control may thus be provided, but this will provide less accurate compensation of aberrations.

The range of travel of the mirror in the z-direction may for example be around 1× the wavelength of incident radiation or less. The range of travel of the mirror in the z-direction will determine magnitude of the aberrations that can be compensated (a larger range will allow compensation or greater magnitude aberrations). In general, the range of travel of the mirror in the z-direction will determine the magnitude of wavefront adjustments that can be made using the minor.

The range of travel of the mirror will be determined at least in part by the thickness of an expansion column (described below) which includes the minor. As explained further above, in embodiments in which it is desired to provide a uniform temperature across the surface of the mirror 30 a thin minor may be provided. In contrast to this, in embodiments in which it is desired to move part of the minor in the z-direction, a thicker mirror may be provided (the thicker mirror forming part of the expansion column).

The number of thermoelectric heat pumps which is provided for a given mirror may depend upon the order of Zernike polynomial adjustment that it is desired to provide using the mirror. For example, an array of 10×10 thermoelectric heat pumps may be used to provide a substantial number of Zernike polynomial adjustments. If the size of the radiation beam incident upon the mirror is expected to be significantly smaller than the minor, then an array of with a larger number of thermoelectric heat pumps may be used (e.g., 20×20 thermoelectric heat pumps), such that around 10×10 thermoelectric heat pumps are available to adjust the radiation beam. The array sizes referred to are merely examples, and any suitable number of thermoelectric heat pumps may be used (e.g., less than 10×10).

The temperature difference between adjacent thermoelectric heat pumps which is needed in order to obtain movement of the mirror 30 by one wavelength in the z-direction can be determined Referring to FIG. 3, the mirror 30, the electrical insulator 41 and the conductor 46 will all expand in the z-direction if their temperature is increased. These materials together may be referred to as an expansion column. The expansion column may be thermally insulated from adjacent expansion columns (e.g., using insulation which extends towards but does not penetrate the reflective surface of the mirror). As a rough approximation, an expansion column comprising copper having a thickness of 5 cm may be assumed. The temperature difference that is required in order to obtain movement in the z-direction of 10.6 microns may be calculated as follows:

$$\Delta T_{max} = \frac{h_{max}}{h_{exp} \cdot \alpha} \tag{2}$$

where $\Delta T_{max}$ is the temperature difference between adjacent thermoelectric heat pumps, $h_{max}$ is the height difference between adjacent thermoelectric heat pumps, $h_{exp}$ is the thickness of the expansion column, and $\alpha$ is the linear coefficient of thermal expansion of the expansion column. The desired height difference $h_{max}$ is taken as being 10.6 microns, the thickness $h_{exp}$ of the expansion column is 5 cm, and copper has a linear coefficient of thermal expansion of 17×10-6 oK-1. In this example, a temperature difference of 12.5 K is needed to obtain a displacement in the z-direction of one wavelength (i.e., 10.6 microns). That is, the mirror area (which may be thought of as a pixel) which is to be moved in the z-direction should be heated to a temperature which is 12.5 K higher than the temperature of adjacent mirror pixels.

In an embodiment, some cross-talk of heat may occur between adjacent thermoelectric heat pumps. Where this is the case, the feed-forward model may be used to compensate, at least in part, for this cross-talk.

An advantage of the reflector apparatus 36 is that its response time may be fast. The reflector apparatus 36 may have a response time which is sufficiently rapid to retain a desired temperature on the surface of the mirror 30 even if the power of radiation incident upon the mirror changes quickly. The reflector apparatus 36 may have a response time of less than 1 millisecond. Thus, for example, if the laser beam 6 is switched off or interrupted then the reflector apparatus 36 may react rapidly to this, for example by adjusting the direction and magnitude of current flow through the thermoelectric heat pumps 38-40. This reaction may for example be triggered by an input to the controller CT from the laser 4 or a sensor (e.g., a pulse energy sensor, or power sensor for a continuous laser).

Providing wavefront corrections, or other corrections of aberrations of the laser beam, may require a significant movement of the mirror 30 in the z-direction, as explained further above. Obtaining these significant movements may require a significant period of time, e.g., of the order of tens of seconds. This is due to the amount of heat which must be delivered to the mirror 30 in order to obtain the z-direction movement. Although this is relatively slow, it may nevertheless be sufficient for wavefront correction, because wavefront errors and other aberrations tend to occur very slowly. If a faster speed of correction is required then this may for example be achieved by reducing the thickness (i.e., length in the z-direction) of the thermoelectric heat pumps 38-40.

The resolution with which the mirror can be moved in the z-direction will determine the accuracy with which wavefront corrections can be achieved. Referring to equation (2) above, it may be seen that a temperature stability of around +/−0.1 K would provide correction with an accuracy of around +/−0.01 wavelengths (for radiation at 10.6 microns). Thermoelectric heat pumps which are stable to within around 0.01 K are available.

The thermoelectric heat pumps 38-40 may for example be arranged in a two-dimensional array (as viewed from above, e.g., looking down onto the thermoelectric heat pumps in the z-direction). The two-dimensional array may for example comprise rectangles (e.g., squares), hexagons, or any other suitable shapes (as viewed from above). Hexagons, or other shapes which allow concentric arrangements of thermoelectric heat pumps may be advantageous because they more easily provide cooling which compensates for concentric heat loads (e.g., as may be generated by an incident laser beam). They may also be advantageous because they more easily provide correction of disk or ring shaped wavefront aberrations.

In addition to or instead of providing wavefront correction (e.g., correction of aberrations), the shape of one or more mirrors may be controlled by the thermoelectric heat pumps to adjust the spatial distribution of intensity in the radiation beam. The laser intensity distribution at the location at which EUV emitting plasma is formed may be adjusted to more closely correspond with the mass distribution of the tin (or other fuel). In this way, energy is more evenly transferred from the laser beam to the tin. As a result, more of the resulting plasma may have a desired temperature, and may therefore emit EUV radiation of a desired wavelength. The mirror shape adjustments may for example take into account feedback such as a measurement of the intensity of EUV radiation emitted by the fuel.

The above description is generally directed towards mirrors which are used to direct an infrared laser beam. However, the invention may also be used for mirrors which are used to direct radiation at any wavelength, for example mirrors which are used to reflect EUV radiation (e.g., mirrors which form part of a lithographic apparatus). The EUV mirrors may be multilayer stacks (e.g., formed using molybdenum and silicon). In an embodiment, the invention may be used to reduce or eliminate temperature variation across the surface of an EUV reflecting mirror. In an embodiment, the invention may be used to maintain an EUV reflecting mirror at a desired temperature when EUV radiation is not incident upon the minor. In an embodiment, the invention may be used to maintain an EUV reflecting minor at a desired temperature when EUV radiation is incident upon the mirror.

In an embodiment, the invention may be used to obtain wavefront correction of EUV radiation reflected from an EUV reflecting minor. However, as explained further above, in order to obtain wavefront correction the z-direction positional accuracy of the thermoelectric heat pumps should significantly less than the wavelength of the incident radiation. This may require thermoelectric heat pumps to be provided which have positions which can be controlled in the z-direction with an accuracy of less than 1 nanometer. This may for example be achieved by fabricating the thermoelectric elements using lithographic techniques. A low thermal expansion material may be used. For example, Ultra Low Expansion glass (ULE) (made from $SiO_2$ and $TiO_2$) may be used.

The circulation of water (or other fluid) through the conduits 35 of the temperature stabilized block 34 may introduce some vibration. This vibration may be sufficiently small that it does not have a noticeable effect upon the mirror 30 when the minor forms part of the laser 4 or beam delivery system. However, the vibration could have a noticeable and undesirable effect when the mirror 30 is an EUV reflecting mirror of a lithographic apparatus. If the vibration would have a noticeable and undesirable effect, then an alternative connection to the temperature stabilized block may be used. For example, instead of rigidly securing the thermoelectric heat pumps to the temperature stabilized block, the thermoelectric heat pumps and the temperature stabilized block may be separately mounted (thereby avoiding or minimizing the transmission of vibrations between them). Flexible heat bridges, for example formed from flexible copper wires, may be used to connect the thermoelectric heat pumps to the temperature stabilized block. If these flexible heat bridges would transmit too much vibration, then they may be omitted. In this case, the thermoelectric heat pumps and the temperature stabilized block may be positioned sufficiently close to one another (although not touching) that radiative heat transfer may be used to transfer heat between them.

The thermoelectric heat pumps may for example be formed from bismuth telluride ($Bi_2Te_3$) and antimony telluride ($Sb_2Te_3$), or some other suitable semiconductor.

The thermoelectric heat pumps may for example be formed from material which is capable of providing a cooling flux of the order of $4 \times 10^5$ $Wm^{-1}$.

Embodiments of the invention have been described in the context of a mirror 30. The mirror 30 is illustrated in FIGS. 3 and 4 as being planar. However, the mirror may have any desired shape. The mirror may be considered to be an example of a reflector. Embodiments of the invention may be used in connection with any suitable reflector. For example, embodiments of the invention may be used in connection with the collector 14 of the source collector apparatus SO (see FIG. 2).

In embodiments of the invention, the thermoelectric heat pumps may each have a first end proximal to and in thermal contact with the reflector. The term "thermal contact" may be interpreted as meaning that a substantial amount of heat can flow between the thermoelectric heat pumps and the reflector. It does not preclude for example one or more materials being located between the thermoelectric heat pumps and the reflector.

In an embodiment the temperature stabilization or adapting the optics for wavefront and/or intensity corrections may be used in the optical cavity of a laser. In another embodiment, the temperature stabilization may be used to mitigate thermal deformations in the optical cavity of the laser, thereby improving its Q-factor. In yet another embodiment, adapting the optics may be used to improve the alignment of the cavity minors of a laser, thereby also improving its Q-factor. Further, adapting the optics may also be used to adjust the laser cavity length. Finally, adapting the optics may be used to control the attenuation of various laser modes, thereby providing control over the laser intensity distribution.

Although the above description is generally directed towards reflectors such as minors, the array of thermoelectric heat pumps may also be applied for thermal conditioning of other objects. As an example, the array of thermoelectric heat pumps may e.g. be applied for the thermal conditioning of a substrate or patterning device. In such arrangement, the present invention may be embodied in a support for supporting an object such as a substrate or a patterning device, the support comprising a support surface configured to receive the object, the support further comprising:

an array of thermoelectric heat pumps each having a first end proximal to and in thermal contact with the support surface and having a second end distal from the support surface, and;

a controller configured to control the thermoelectric heat pumps, whereby the controller is configured to, in use, determine a temperature of the object from a voltage measured across at least one of the thermoelectric heat pumps.

Such a support may e.g. be part of a support structure or support table such as support structure MT or support table WT as described above. Such a support may e.g. be provided with one or more clamps or clamping means to hold the object onto the support surface. Such clamps or clamping means may e.g. include electrostatic clamps or vacuum clamps. When using such a support, a temperature distribution of the object may accurately be determined by using one or more of the thermoelectric heat pumps as temperature sensors (either as dedicated sensors or alternatingly as sensor or heat source, as discussed above). By monitoring an actual temperature distribution of the object (e.g. a substrate or patterning device) and correcting, when necessary, the temperature distribution using the array of thermoelectric heat pumps, undesired, thermally induced, deformations of the object may be mitigated or avoided.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein. The descriptions above are intended to be illustrative, not limiting. Thus it will be apparent to one skilled in the art that modifications may be made to the invention as described without departing from the scope of the claims set out below.

The invention claimed is:

1. A reflector apparatus comprising:
   a reflector and an array of thermoelectric heat pumps, wherein each thermoelectric heat pump is electrically insulated from another and comprises a first and a second semiconductor block and an electrical insulation layer disposed between the first and second semiconductor blocks; and
   a controller configured to independently control each thermoelectric heat pump of the array of thermoelectric heat pumps, whereby the controller is configured to determine a temperature of the reflector from a voltage measured across at least one of the thermoelectric heat pumps.

2. The reflector apparatus according to claim 1, wherein the controller is configured to control a supply voltage applied across the thermoelectric heat pumps.

3. The reflector apparatus according to claim 2, further comprising a power source configured to supply a supply voltage across the thermoelectric heat pumps.

4. The reflector apparatus according to claim 2, wherein the controller is configured to alternatingly apply the supply voltage to at least one of the thermoelectric heat pumps in order to heat or cool the reflector and disconnect the at least one of the thermoelectric heat pumps from the supply voltage to enable a measurement of the voltage across the at least one of the thermoelectric heat pumps.

5. The reflector apparatus according to claim 1, wherein the controller is configured to periodically determine the temperature of the reflector from the voltage measured across the at least one of the thermoelectric heat pumps.

6. The reflector apparatus of claim 1, wherein the controller is configured to use feed-forward correction to control the thermoelectric heat pumps.

7. The reflector apparatus of claim 1, wherein the controller is configured to use feed-back correction to control the thermoelectric heat pumps.

8. The reflector apparatus of claim 7, wherein the feed-back correction is based on the determined temperature of the reflector.

9. The reflector apparatus of claim 1, wherein the first semiconductor block is positively doped and the second semiconductor block is negatively doped.

10. The reflector apparatus of claim 1, wherein the array of thermoelectric heat pumps is a two-dimensional array.

11. The reflector apparatus of claim 1, wherein the thermoelectric heat pumps are individually controllable.

12. The reflector apparatus of claim 11, wherein the controller is configured to adjust a wavefront of radiation reflected by the reflector, by maintaining a temperature difference between mirror areas connected to adjacent thermoelectric heat pumps.

13. The reflector apparatus of claim 11, wherein the controller is configured to maintain a substantially equal temperature across the reflector using the thermoelectric heat pumps.

14. The reflector apparatus of claim 1, wherein the controller is configured to reverse the polarity of current supplied to the thermoelectric heat pumps if radiation ceases to be incident upon the reflector.

15. A laser or beam delivery system comprising the reflector of claim 1.

16. A lithographic apparatus comprising:
an illumination system configured to condition a radiation beam;
a substrate table constructed to hold a substrate; and
a projection system configured to project the radiation beam onto a target portion of the substrate,
wherein a reflector of the illumination system or the projection system is a reflector apparatus according to claim 1.

17. A method of controlling the temperature of a reflector, the method comprising:
supplying power to an array of thermoelectric heat pumps, wherein each thermoelectric heat pump is electrically insulated from another and comprises a first and a second semiconductor block and an electrical insulation layer disposed between the first and second semiconductor blocks, the power supplied to the array of thermoelectric heat pumps causing the thermoelectric heat pumps to remove heat from or transfer heat to the reflector;
independently controlling each thermoelectric heat pump of the array of thermoelectric heat pumps; and
determining a temperature of the reflector from a voltage measured across at least one of the thermoelectric heat pumps.

18. The method of claim 17, wherein a temperature difference is maintained between mirror areas connected to adjacent thermoelectric heat pumps, thereby adjusting a wavefront of radiation reflected by the reflector.

19. The method of claim 18, wherein the spatial intensity of the radiation is adjusted to more closely correspond to a distribution of fuel upon which the radiation is incident.

20. A support for supporting an object, the support comprising;
a support surface configured to receive the object, the support further comprising:
an array of thermoelectric heat pumps, wherein each thermoelectric heat pump is electrically insulated from another and comprises a first and a second semiconductor block and an electrical insulation layer disposed between the first and second semiconductor blocks; and
a controller configured to independently control each thermoelectric heat pump of the array of thermoelectric heat pumps, whereby the controller is configured to, in use, determine a temperature of the object from a voltage measured across at least one of the thermoelectric heat pumps.

* * * * *